United States Patent [19]

Takemae et al.

[11] Patent Number: 4,660,174
[45] Date of Patent: Apr. 21, 1987

[54] SEMICONDUCTOR MEMORY DEVICE HAVING DIVIDED REGULAR CIRCUITS

[75] Inventors: Yoshihiro Takemae, Tokyo; Tomio Nakano, Kawasaki; Kimiaki Sato, Tokyo, all of Japan

[73] Assignee: Fujitsu Limited, Kawasaki, Japan

[21] Appl. No.: 625,682

[22] Filed: Jun. 28, 1984

[30] Foreign Application Priority Data

Jun. 29, 1983 [JP] Japan ................. 58-115878

[51] Int. Cl.$^4$ .................................. G11C 5/00
[52] U.S. Cl. ........................................ 365/63; 365/51
[58] Field of Search ...................... 365/51, 63

[56] References Cited

U.S. PATENT DOCUMENTS 3,936,812  2/1976  Cox et al. ................. 365/63
4,527,254  7/1985  Ryan et al. ................ 365/51

Primary Examiner—Joseph A. Popek
Attorney, Agent, or Firm—Staas & Halsey

[57] ABSTRACT

In a semiconductor memory device including word lines (WL) and bit lines (BL), a regular pattern circuit area comprising elements regularly arranged in line with the word lines and/or the bit lines is divided into a plurality of blocks (1-1, 1-2). Provided between the divided blocks are irregular or peripheral circuit areas (2). Provided outside of the divided blocks are pads ($P_1$ to $P_{16}$).

17 Claims, 16 Drawing Figures

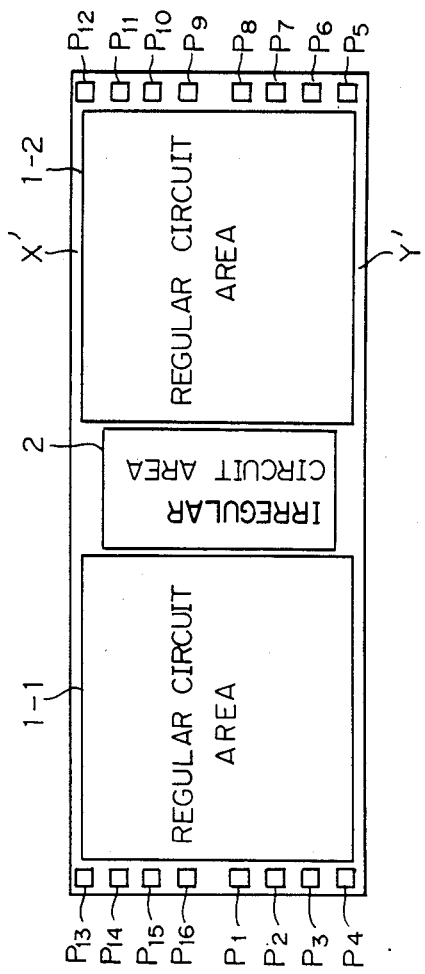

SEMICONDUCTOR MEMORY DEVICE HAVING DIVIDED REGULAR CIRCUITS

BACKGROUND OF THE INVENTION

1. Field of the Invention

The present invention relates to a semiconductor memory device and, more particularly, to the improvement of the arrangement of peripheral circuits and bonding pads on a semiconductor chip.

2. Description of the Prior Art

The layout of a semiconductor memory device such as a dynamic or static random access memory (RAM) is divided mainly into a regular pattern circuit area, a peripheral circuit area, and a bonding pad area. Provided in the regular circuit area are circuits repeated regularly in line with word lines and/or bit lines. For example, memory cells are arranged in line with the word lines and the bit lines, row decoders are arranged in line with the word lines, and sense amplifiers and column decoders are arranged in line with the bit lines. Contrary to the above, no word line and no bit line is provided in the peripheral circuit area. That is, irregular pattern circuits are provided in the peripheral circuit area. The layout for such a regular pattern circuit area, an irregular or peripheral circuit area, and a bonding pad area is important when considering a high capacity semiconductor device.

According to one prior art layout of a semiconductor memory device, two peripheral circuit areas are provided on both sides of a regular circuit area. Further provided outside of the peripheral circuit areas are bonding pad areas. In this case, the peripheral circuit areas have to be connected directly or indirectly to each pad of the bonding pad areas. Therefore, one of the peripheral circuit areas has to somehow be connected to each pad located on the opposite side thereof, and vice versa. In this case, one peripheral circuit is connected directly to a power supply pad and some pads located on the opposite side thereof, and via the other peripheral circuit is connected to the other signal pads located on the opposite side thereof. As a result, the total line width of the signal lines and power supply lines linking the peripheral circuits and the pads and bypassing the regular circuit area becomes large, thereby reducing the area of the regular pattern circuit area, which is disadvantageous when trying to provide high capacity.

In addition, when the above-mentioned device is mounted on a cerdip or plastic package, some of the bonding posts of the package may be superimposed on the others, in order to reduce the capacitances of the connections between the bonding pads of the device and the bonding posts of the package. This reduces the entire area of the device, thereby reducing the area of the regular pattern circuit area, which is also disadvantageous to providing high capacity.

Further, there are many types of packages. For example, from a viewpoint of shapes, there are DIP's, leadless packages, flat packages, and the like, and from a viewpoint of materials and sealed states, there are metal sealed packages, cerdip packages, plastic packages, and the like. The configuration of the bonding posts of a package depends upon the type of package. However, in a semiconductor device, each pad has a purpose different from that of the other pads. Therefore, when a semiconductor device is designed for a certain type of package, such a semiconductor device may not be mounted in another type of package, due to the different arrangement of the bonding posts of the package. If such a semiconductor device is forced into another type of package, the connections linking the bonding pads and the bonding posts become very long, thereby reducing the cavity of the package and increasing the capacitance of the connections. Also, wire-bonding operations for the above-mentioned connections become difficult, thereby increasing the manufacturing cost.

SUMMARY OF THE INVENTION

It is an object of the present invention to provide a high capacity semiconductor memory device. It is another object of the present invention to provide a semiconductor memory device having a low manufacturing cost.

According to the present invention, in a semiconductor memory device including word lines and bit lines, a regular pattern circuit area comprising elements regularly arranged in line with the word lines and/or the bit lines is divided into a plurality of blocks. Provided between the divided blocks are irregular or peripheral circuit areas, thereby reducing the total line width of the signal and power supply lines linking the peripheral circuit areas and the pads and bypassing the divided regular circuit areas. As a result, the occupied area of the regular pattern circuit area is increased thereby increasing the capacity thereof.

In addition, there are provided a plurality of pads, each pad having the same purpose. One of the pads having the same purpose is selected and connected to one bonding post of a requested package, thereby shortening the connections linking the bonding pads and the bonding posts. As a result, the cavity of the package is increased, the capacitances of the connections linking the bonding pads and the bonding posts are reduced, and in addition, the wire-bonding operation for these connections is easy, thereby reducing the manufacturing cost.

BRIEF DESCRIPTION OF THE DRAWINGS

The present invention will be more clearly understood from the description as set forth below with reference to the accompanying drawings, wherein:

FIG. 2A is a layout diagram of a first embodiment of the semiconductor memory device according to the present invention;

DESCRIPTION OF THE PREFERRED EMBODIMENTS

Figure 1A:
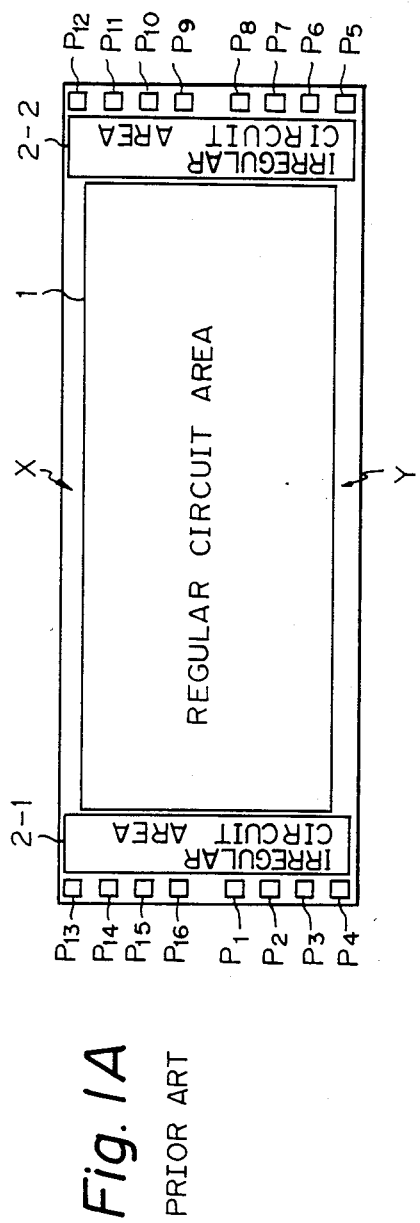
FIG. 1A is a layout diagram of a prior art semiconductor memory device.

In FIG. 1A, a prior art example of a 16-pin dynamic RAM is illustrated. Provided on both sides of a regular pattern circuit area 1 are peripheral circuit areas 2-1 and 2-2. The regular pattern circuit area 1 comprises memory cells, row decoders, column decoders, sense amplifiers, and the like arranged in line with word lines and/or bit lines. The peripheral circuit areas 2-1 and 2-2 comprise irregular pattern circuits. In addition, provided outside of the peripheral circuit areas 2-1 and 2-2 are bonding pads $P_1$ through $P_{16}$. Here, the pad $P_{16}$ is for a power supply $V_{SS}$, the pad $P_8$ is for a power supply $V_{CC}$, and the other pads are for control signals and address signals. The device of FIG. 1 is suitable for a dual-inline package (DIP).

In FIG. 1, both of the peripheral circuit areas 2-1 and 2-2 have to be connected directly or indirectly to the pads $P_1$ to $P_{16}$. That is, the peripheral circuit 2-1 is connected directly to the $V_{CC}$ power supply pad $P_8$, and via the peripheral circuit 2-2, is connected to the pads $P_5$, $P_6$, $P_7$, $P_9$, $P_{10}$, $P_{11}$, and $P_{12}$. In this case, the peripheral circuit 2-2 converts signals from the pads $P_5$, $P_6$, $P_7$, $P_9$, $P_{10}$, $P_{11}$, and $P_{12}$, into timing signals, control signals and the like, and transmits them to the peripheral circuit 2-1 via signal lines passing through areas X and Y. Similarly, the peripheral circuit 2-2 is connected directly to the $V_{SS}$ power supply pad $P_{16}$, and via the peripheral circuit 2-1, is connected to the pads $P_1$, $P_2$, $P_3$, $P_4$, $P_{13}$, $P_{14}$, and $P_{15}$. In this case, the peripheral circuit 2-1 converts signals from the pads $P_1$, $P_2$, $P_3$, $P_4$, $P_{13}$, $P_{14}$, and $P_{15}$, into timing signals, control signals and the like, and transmits them to the peripheral circuit 2-2 via signal lines in the areas X and Y. Therefore, the pads $P_5$ to $P_{12}$ are directly or indirectly connected via the areas X and Y to the peripheral circuit area 2-1, while the pads $P_1$ to $P_4$ and $P_{13}$ to $P_{16}$ are substantially connected also via the areas X and Y to the peripheral circuit area 2-2.

In the areas X and Y, the line width of each power supply line for the pads $P_8$ and $P_{16}$ is, for example, about 100 μm, so that the resistance thereof is sufficiently low. In addition, the line width of each signal line for the other pads is typically 6 μm, and the number thereof can be 20 to 30. Therefore, the total line width of the lines at the areas X and Y is, for example:

$$100 \times 2 + 6 \times (20 \sim 30) = 300 \text{ to } 400 \text{ μm}.$$

This total width limits the size of the regular circuit area 1, which is disadvantageous to enabling high capacity.

Figure 1B:
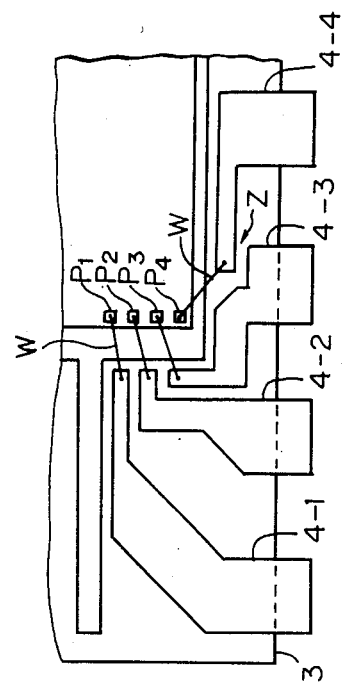
FIG. 1B is a partial layout diagram of the device of FIG. 1 mounted on a cerdip or plastic pckage.

In addition, as illustrated in FIG. 1B, when the device in FIG. 1A is mounted on a cerdip or plastic package 3 having bonding posts 4-1, 4-2, 4-3, 4-4, . . . , wires W between the pads $P_1$, $P_2$, $P_3$, and $P_4$, and the bonding posts 4-1, 4-2, 4-3, and 4-4, respectively, are shortened to reduce their capacitances. In this case, however, the bonding post 4-3 of the third pin is superimposed on the bonding post 4-4 of the fourth pin at a portion Z. This also limits the area of the device of FIG. 1, and, accordingly, is disadvantageous to providing high capacity.

Further, if the device of FIG. 1A is mounted on a leadless chip carrier, some of the connections linking the bonding pads and the bonding posts become remarkably long, thereby reducing the cavity of the package and increasing the capacitances of the connections, and wire-bonding operations for the connections becomes difficult.

Figure 2B:
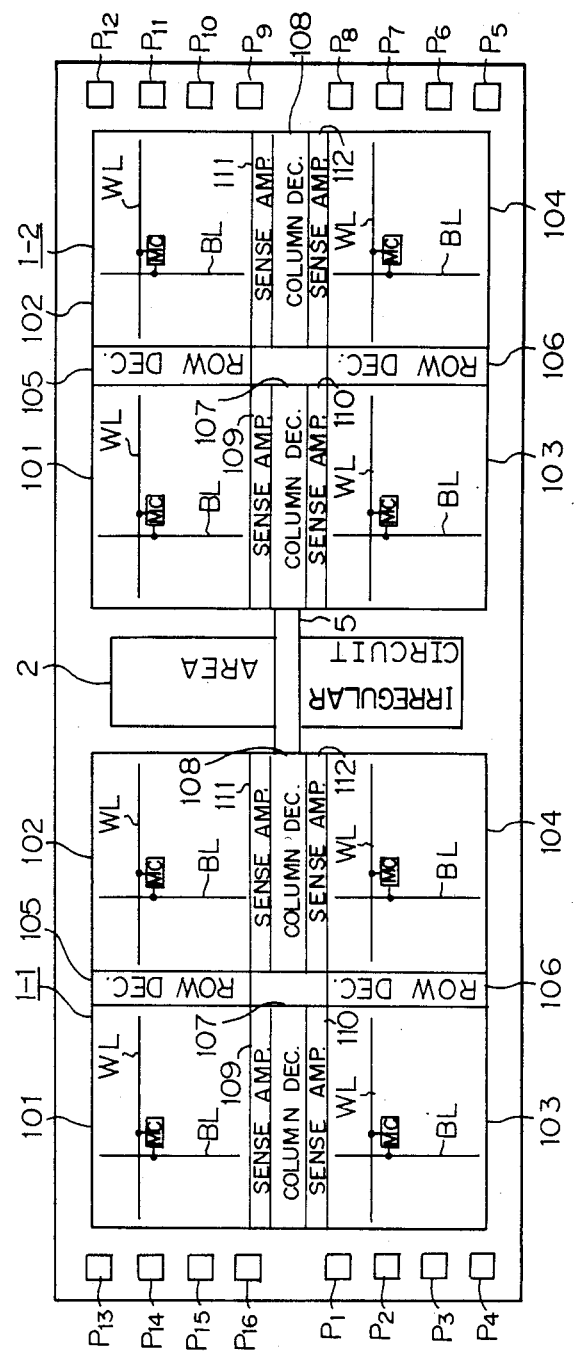
FIG. 2B is a detailed layout diagram of the device of FIG. 2A.

In FIG. 2A, which illustrates a first embodiment of the present invention, and in FIG. 2B, which is a more detailed layout diagram of FIG. 2A, regular pattern circuit areas 1-1 and 1-2 are provided at the right and left sides of the device, and a peripheral circuit area 2 is provided therebetween. In addition, bonding pads $P_1$ through $P_{16}$ are provided outside of the regular circuit areas 1-1 and 1-2.

As shown in FIG. 2B, each of the regular circuit areas 1-1 and 1-2 comprises four memory cell arrays 101, 102, 103 and 104 having memory cells at intersections between word lines WL and bit lines BL, two row decoder areas 105 and 106 having one row decoder for every word line, two column decoder areas 107 and 108 having one column decoder for every bit line, and four sense amplifier areas 109, 110, 111, and 112 having one sense amplifier for each bit line pair. Provided commonly for the regular circuit areas 1-1 and 1-2 are lines 5 for address signals, a bit line charging signal, a word line driving signal, a sense amplifier driving signal, a column decoder driving signal, and the like.

In FIG. 2A, the distance between the peripheral circuit area 2 and the power supply pads $P_8$ and $P_{16}$ is half that of the device shown in FIG. 1A. Therefore, the width of the power supply lines between the peripheral circuit 2 and the power supply pads $P_8$ and $P_{16}$ can be halved with respect to their resistances, and, in addition, the number of power supply lines passing through the areas X' and Y' can be halved. Therefore, the total area used by the lines in the areas X' and Y' is approximately one quarter that of the device shown in FIG. 1A in with respect to the other lines. Note that, since the number of lines in the areas X' and Y' on both sides of the regular circuit areas 1-1 and 1-2 are different from each other, the positions of regular circuit areas 1-1 and 1-2 at the Y direction may differ from each other.

Figure 2C:
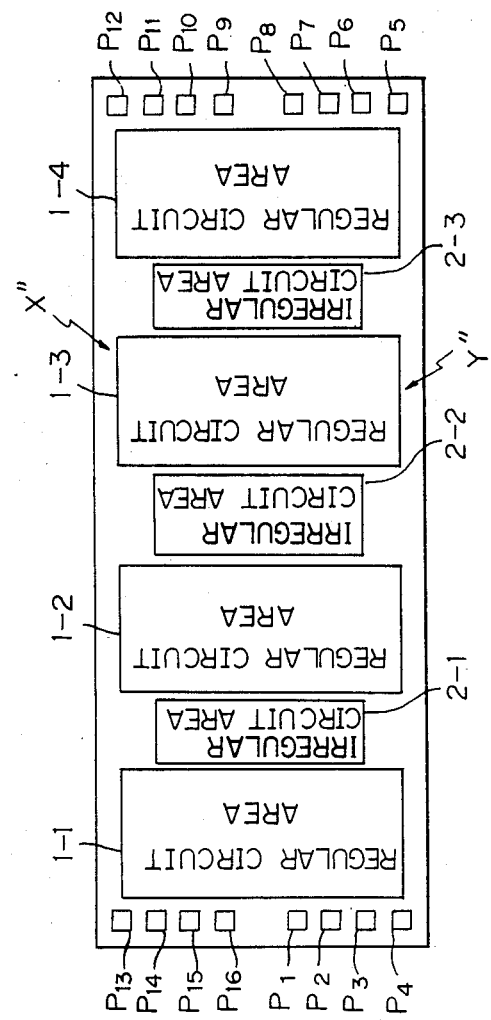
FIG. 2C is a layout diagram of a modification of the device of FIG. 2A.

In FIG. 2C, which is a modification of the device of FIG. 2A, four regular circuit areas 1-1, 1-2, 1-3, and 1-4 are provided, and three peripheral circuit areas 2-1, 2-2, and 2-3 are provided therebetween. In addition, pads $P_1$ through $P_{16}$ are provided outside the regular pattern circuit areas 1-1 and 1-4. In this device of FIG. 2C, the distance between the peripheral circuit such as 2-1 and the power supply pads $P_8$ is about three-quarters of that shown in FIG. 1A. Therefore, the width of the power supply lines between the peripheral circuits and the power supply pads can be reduced with respect to their resistances, as compared with that of FIG. 1A. Therefore, the total width of the lines at areas X" and Y" is reduced as compared with that of FIG. 1A. Note that the devices of FIGS. 2A and 2C are expected to be mounted on a DIP.

Figure 3A:
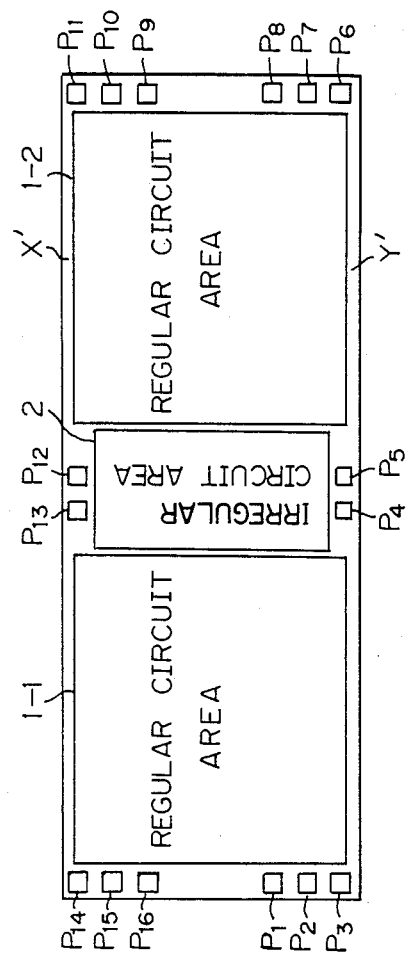
FIG. 3A is a layout diagram of a second embodiment of the semiconductor memory device according to the present invention.
Figure 3B:
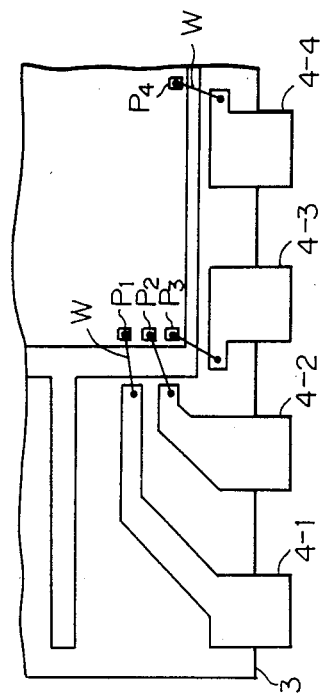
FIG. 3B is a partial layout diagram of the device of FIG. 3A mounted on a cerdip or plastic package.

In FIG. 3A, which illustrates a second embodiment of the present invention, the pads $P_4$, $P_5$, $P_{12}$, and $P_{13}$ are provided at the center of the device, i.e., outside of the peripheral circuit area 2, since this device of FIG. 3A is, in this case, expected to be mounted on a cerdip or plastic package. That is, as shown in FIG. 3B, when the device of FIG. 3A is mounted on a cerdip or plastic package, the bonding post 4-3 of the third pin is not superimposed on the bonding post 4-4 of the fourth pin, so that the cavity of the package is increased, thereby increasing the capacity of the device of FIG. 3A.

Figure 3C:
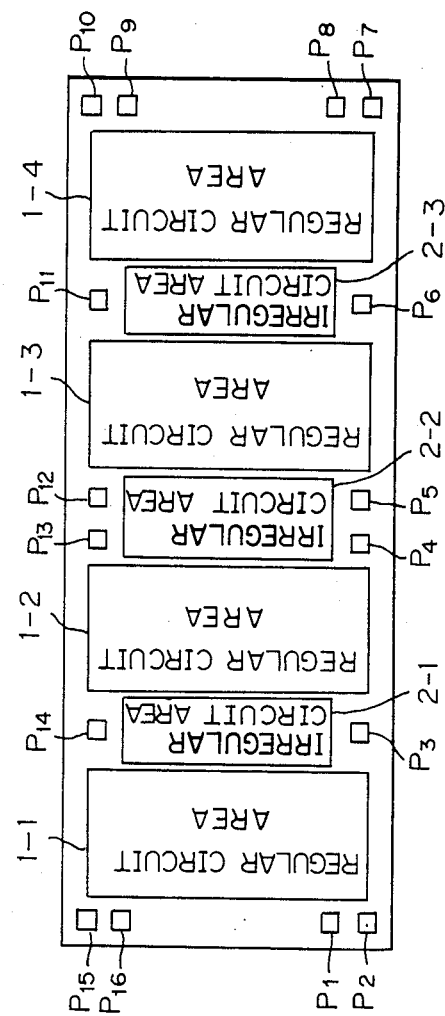
FIG. 3C is a layout diagram of a modification of the device of FIG. 3A.

FIG. 3C is a modification of the device of FIG. 3A, and also corresponds to FIG. 2C. That is, as compared with the device of FIG. 2C, the pads $P_{14}$ and $P_3$ are arranged outside of the peripheral circuit area 2-1, the pads $P_{13}$, $P_{12}$, $P_4$, and $P_5$ are arranged outside of the peripheral circuit area 2-2, and the pads $P_{11}$ and $P_6$ are arranged outside of the peripheral circuit area 2-3. This type of device shown in FIG. 3C is also expected to be mounted on a cerdip or plastic package. Thus, the total width of lines bypassing the regular circuit areas can be reduced, thereby attaining a high capacity device.

Figure 4A:
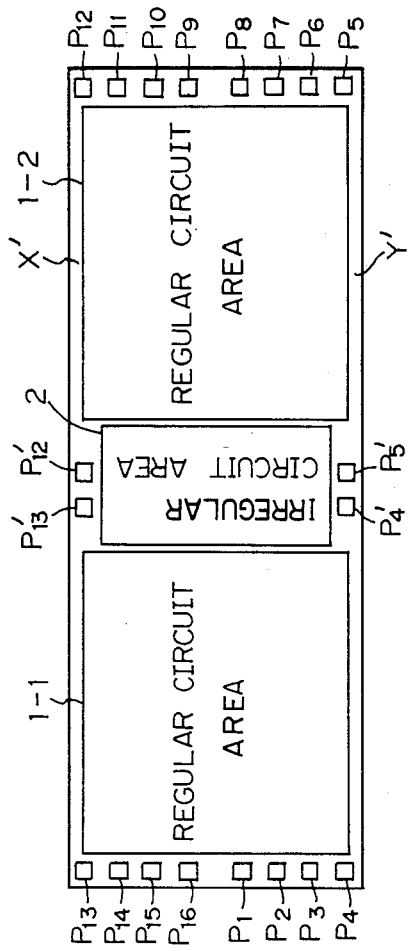
FIG. 4A is a layout diagram of a third embodiment of the semiconductor memory device according to the present invention.

In FIG. 4A, which illustrates a third embodiment of the present invention, pads $P'_4$, $P'_5$, $P'_{12}$, and $P'_{13}$ are added to the elements of FIG. 2A. Note that the pads $P'_4$, $P'_5$, $P'_{12}$, and $P'_{13}$ have the same purpose as the pads $P_4$, $P_5$, $P_{12}$, and $P_{13}$, respectively. Therefore, one of the pads $P_4$ and $P'_4$, one of the pads $P_5$ and $P'_5$, one of the pads $P_{12}$ and $P'_{12}$, and one of the pads $P_{13}$ and $P'_{13}$ are selected and connected by a wire bonding operation to the respective bonding posts of a package. As a result, the device of FIG. 4A can be mounted on various types of packages.

Figure 4B:
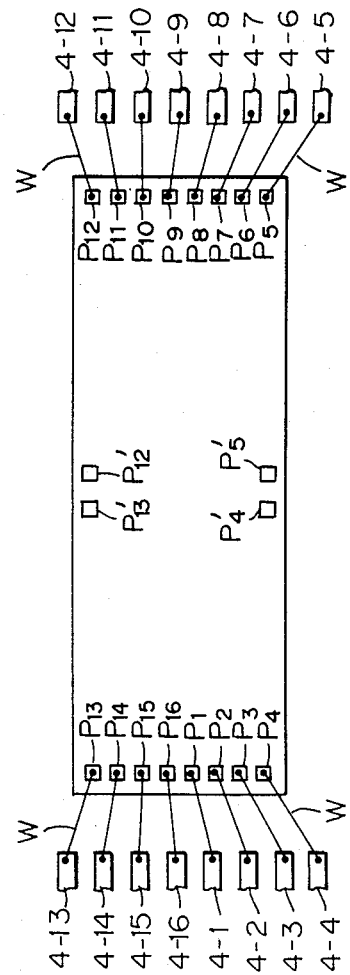
FIG. 4B is a layout diagram of the device of FIG. 4A mounted on a package of the metal-seal type.

FIG. 4B shows the case where the device of FIG. 4A is mounted on a ceramic package of a metal-sealed type. In this case, bonding posts are arranged on both sides of the package (not shown). That is, the posts 4-1, 4-2, 4-3, 4-4, 4-13, 4-14, 4-15, and 4-16 are arranged on the left side of the package, while the pads 4-5, 4-6, 4-7, 4-8, 4-9, 4-10, 4-11, and 4-12 are arranged on the right side of the package. Therefore, in this case, the pads $P_1$ through $P_{16}$ of the device are connected by wires W to the bonding pads 4-1 through 4-16, respectively, and the pads $P'_4$, $P'_5$, $P'_{12}$, $P'_{13}$ have no connections to the bonding posts. Note that the provision of bonding posts on the top and bottom sides of a metal-sealed type package reduces the cavity thereof. Therefore, such bonding posts are not usually provided.

Figure 4C:
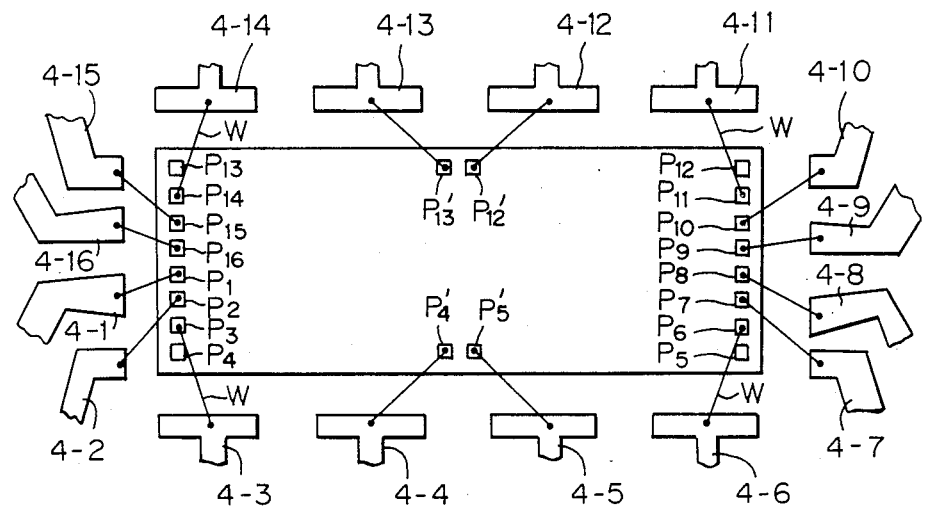
FIG. 4C is a layout diagram of the device of FIG. 4A mounted on a cerdip or plastic package.

FIG. 4C shows the case where the device of FIG. 4A is mounted on a cerdip or plastic package. In this case, bonding posts are also present on the top and bottom sides of the package (not shown). That is, it is usually difficult to arrange all the bonding posts on both sides of a cerdip or plastic package. Therefore, the pads $P'_4$, $P'_5$, $P'_{12}$, and $P'_{13}$ are connected by wires W to the bonding posts 4-4, 4-5, 4-12, and 4-13, respectively, and the pads $P_4$, $P_5$, $P_{12}$, and $P_{13}$ have no connections to the bonding posts, since the pads $P'_4$, $P'_5$, $P'_{12}$, and $P'_{13}$ are closer to the bonding posts 4-4, 4-5, 4-12, and 4-13 than the pads $P_4$, $P_5$, $P_{12}$, and $P_{13}$.

Figure 4D:
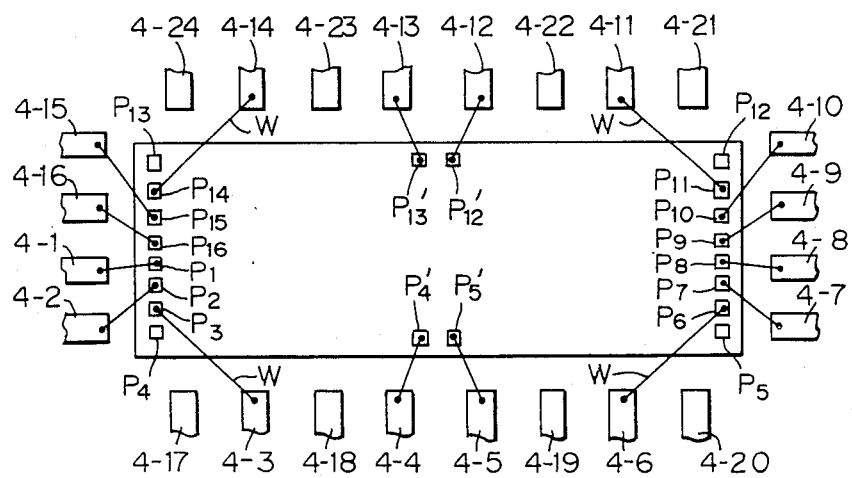
FIG. 4D is a layout diagram of the device of FIG. 4A mounted on a leadless chip carrier.

FIG. 4D shows the case where the device of FIG. 4A is mounted on a leadless chip carrier. In this case, bonding posts are arranged equidistantly on all sides of the carrier (not shown), and it is not necessary to carry out a wire-bonding operation upon all of the bonding posts. Therefore, although the pads $P'_4$, $P'_5$, $P'_{12}$, and $P'_{13}$ are connected by wires W to the bonding 4-4, 4-5, 4-12, and 4-13, respectively, the pads $P_4$, $P_5$, $P_{12}$, and $P_{13}$ have no connections to the posts, and the posts 4-17 through 4-24 have no connections to the pads.

Thus, in the third embodiment, since a plurality of pads having the same purpose are provided on a semiconductor device, one of the pads having the same purpose is selected depending on the arrangement of bonding posts of a certain type of package. The above-mentioned pads having the same purpose have to each be connected to an interior circuit of the device. For this reason, there is prepared a circuit for connecting the pads having the same purpose to each other. Such a circuit for the pads 13 and 13' is illustrated in FIGS. 5A, 5B, 5C and 5D.

Figure 5A:
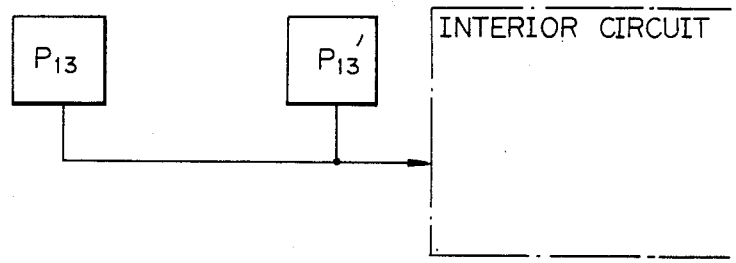
FIGS. 5A, 5B, 5C, and 5D are circuit diagrams of circuits for the connections of the pads of FIG. 4A.

In FIG. 5A, the pads $P_{13}$ and $P'_{13}$ are connected directly to the same conductive layer, such as an aluminium layer, which leads to the interior circuit of the device. In this circuit of FIG. 5A, however, when the pad $P_{13}$ is used, the capacitance of the pad $P'_{13}$ increases the capacitance of the pad $P_{13}$, thereby reducing the propagation speed of a signal thereon.

Figure 5B:
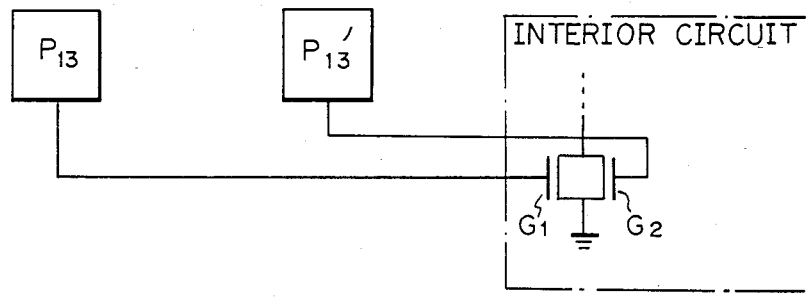

In FIG. 5B, the pads $P_{13}$ and $P'_{13}$ are connected to gates $G_1$ and $G_2$ connected in parallel within the interior circuit. Therefore, the circuit of FIG. 5B avoids the disadvantage of the device of FIG. 5A. However, since an unused pad such as $P'_{13}$ is in a floating state, the gate $G_2$ may operate due to noise or the like, thereby inviting an erroneous operation. Note that the gates $G_1$ and $G_2$ are of a metal-oxide semiconductor (MOS) transistor type, however, another type of gate such as a bipolar transistor can be used in accordance with the type of device.

Figure 5C:
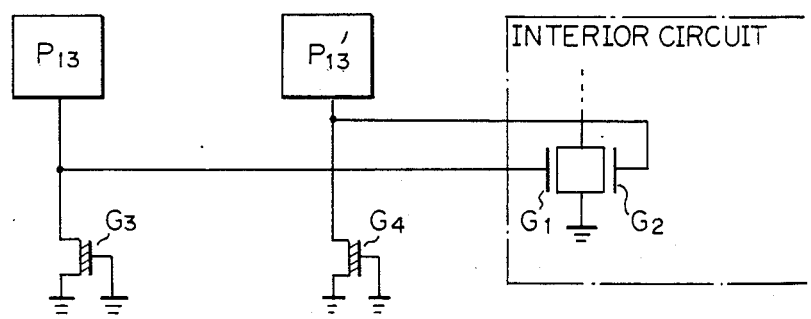

In FIG. 5C, depletion-type transistors $G_3$ and $G_4$ are added to the elements of FIG. 5B. Therefore, an unused pad such as $P'_{13}$ is grounded by the transistor $G_4$, thereby preventing the pad $P'_{13}$ from being in a floating state. Thus, the disadvantage of the circuit of FIG. 5B is avoided. Of course, the conductivity of the depletion-type transistors $G_3$ and $G_4$ is designed in consideration of the potential at the used pad such as $P_{13}$ being at a suitable value. Note that enhancement-type drain-gate connected transistors can be used instead of the depletion-type transistors $G_3$ and $G_4$.

Figure 5D:
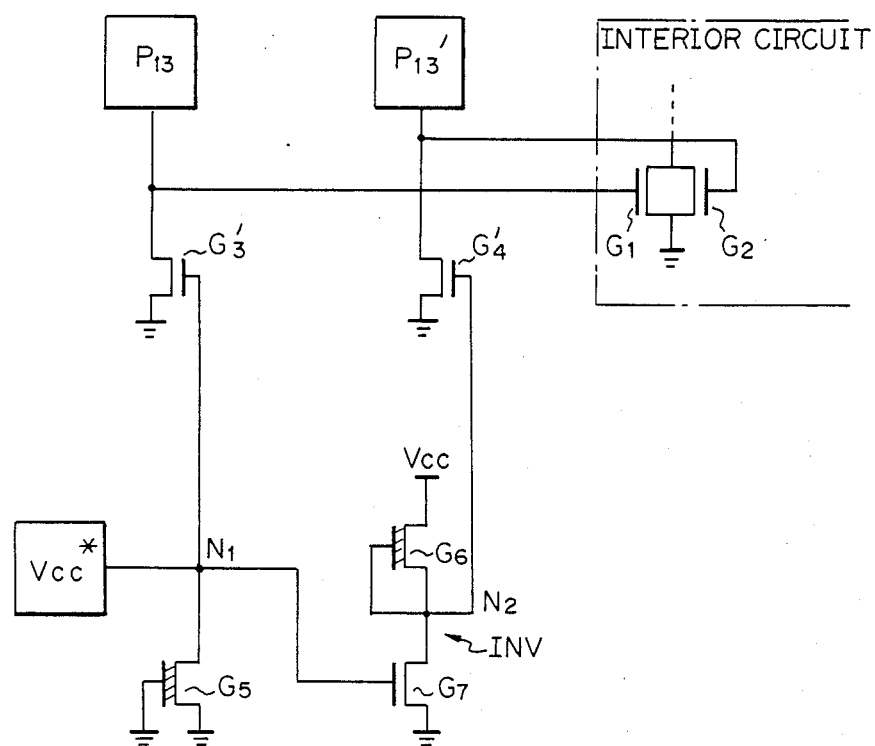

In FIG. 5D, enhancement-type transistors $G'_3$ and $G'_4$ are used to prevent unused pads from being in a floating state. The transistors $G'_3$ and $G'_4$ are selected by a selection circuit by depletion-type transistors $G_5$ and $G_6$, and an enhancement-type transistor $G_7$. An additional pad $V_{CC}*$ is provided. Note that the transistors $G_6$ and $G_7$ constitute an inverter INV.

In the circuit of FIG. 5D, when the pad $V_{CC}*$ is opened, i.e., when the pad $V_{CC}*$ has only a connection to the node $N_1$, the potential at the node $N_1$ is at the ground level, so that the transistor $G'_3$ is cut off. Thus, the pad $P_{13}$ is in a used state. In addition, the potential at the node $N_2$ is high and turns on the transistor $G'_4$. As a result, the pad $P'_{13}$ is grounded and accordingly, the pad $P'_{13}$ is in an unused state.

In the circuit of FIG. 5D, when the pad $V_{CC}*$ is bonded to the pad $P_8$ which is for the power supply $V_{CC}$, the potential at the node $N_1$ becomes high and turns on the transistor $G'_3$. Thus, the pad $P_{13}$ is in an unused state. In addition, the potential at the node $N_2$ is low and cuts off the transistor $G'_4$. Thus, the pad $P'_{13}$ is in a used state. Thus, in the circuit of FIG. 5D, an unused pad is grounded, thereby preventing the unused pad from being in a floating state.

As explained hereinabove, the regular circuit areas including memory cells can be increased, thereby enhancing the capacity thereof.

What is claimed is:

1. A semiconductor memory device having a periphery, comprising:
   a plurality of word lines;
   a plurality of bit lines;
   at least two separated regular pattern circuit areas, each comprising first elements operatively connected to and arranged regularly in line with at least one of said word lines and said bit lines;

an irregular circuit area, arranged between said separated regular pattern circuit areas, said irregular circuit area comprising second elements operatively connected to said regular pattern circuit areas and irregularly arranged with respect to the one of said word lines and said bit lines; and bonding pad areas, operatively connected to said irregular circuit area, arranged on the periphery of said device.

2. A device as set forth in claim 1, wherein said bonding pad areas comprise first pads, operatively connected to said irregular circuit area and arranged outside of said separated regular pattern circuit areas on the periphery of said device.

3. A device as set forth in claim 2, wherein said bonding pad areas further comprise second pads, operatively connected to said irregular circuit area and arranged outside of said irregular circuit area on the periphery of said device.

4. A device as set forth in claim 3,
wherein each of said second pads, arranged outside of said irregular circuit area, is provided to transfer a signal which may be an unvarying potential used in powering said device, and
wherein corresponding pads, included in said first pads arranged outside said separated regular pattern circuit areas, each transfers a signal substantially identical to the signal transferred by a corresponding one of the second pads.

5. A device as set forth in claim 4, further comprising electrically connecting means, operatively connected to said irregular circuit area and to each of said second and corresponding first pads, respectively, for connecting said second and corresponding pads, transferring substantially identical signals, to each other.

6. A device as set forth in claim 5, wherein said electrically connecting means comprises connections operatively connected to said irregular circuit area and said second and corresponding first pads transferring substantially identical signals.

7. A device as set forth in claim 5, wherein said electrically connecting means comprises gates operatively connected in parallel, each of said gates being operatively connected to one of said second and corresponding pads.

8. A device as set forth in claim 7,
wherein each of said second and corresponding first pads have a potential, and
further comprising preventing means, each of said preventing means operatively connected to ground and one of said second and corresponding first pads transferring substantially identical signals, for preventing the potential of the one of said second and corresponding first pads from being in a floating state.

9. A device as set forth in claim 8, further comprising means, operatively connected to said preventing means, for selecting and operating only one of said preventing means in each pair of said second and corresponding first pads.

10. A semiconductor memory device on a semiconductor chip having first and second edges, a third edge opposite from the first edge, and a fourth edge between the first and third edge and opposite from the second edge, said device including word lines and bit lines and comprising:

a first regular pattern circuit area, located closer to the first edge than the third edge, having formed therein first circuit elements operatively connected to the word and bit lines and arranged in a regular pattern with respect to at least one of the word and bit lines;

a second regular pattern circuit area, located closer to the third edge than the first edge, having formed therein second circuit elements operatively connected to the word and bit lines and arranged in a regular pattern with respect to the one of the word and bit lines; and an irregular circuit area, located between said first and second regular pattern circuit areas, having formed therein third circuit elements irregularly arranged with respect to the one of the word and bit lines.

11. A semiconductor memory device as set forth in claim 10, wherein said device includes bonding posts and further comprises:

a first bonding pad area, located between said first regular pattern circuit area and the first edge of the chip, having formed therein first bonding pad means, operatively connected to the third circuit elements in said irregular circuit area, for connecting the chip to the bonding posts of said device, and a second bonding pad area, located between said second regular pattern circuit area and the third edge of the chip, having formed therein second bonding pad means, operatively connected the third circuit elements in said irregular circuit area, for connecting the chip to the bonding posts of said device.

12. A semiconductor memory device as set forth in claim 11, further comprising:

a third bonding pad area, located between said irregular pattern area and the second edge of the chip, having formed therein third bonding pad means, operatively connected to the third circuit elements in said irregular circuit area, for connecting the chip to the bonding posts of said device; and a fourth bonding pad area, located between said irregular circuit area and the fourth edge of the chip, having formed therein bonding pad means, operatively connected to the third circuit elements in said irregular circuit area, for connecting the chip to the bonding posts of said device.

13. A semiconductor memory device as set forth in claim 12,
wherein said first, second, third and fourth bonding pad means each comprises bonding pads, operatively connected to the third circuit elements in said irregular circuit area, and
wherein at least some of the bonding pads in said third and fourth bonding pad areas include alternative bonding pads which provide functions that are identical to corresponding bonding pads in said first and second bonding pad areas.

14. A device as set forth in claim 1, wherein said irregular circuit area comprises peripheral circuits operatively connected to said separated regular pattern circuit areas and said bonding pad areas.

15. A device as set forth in claim 14, wherein said peripheral circuits comprise input/output circuits operatively connected to said separated regular pattern circuit areas and said bonding pad areas.

16. A semiconductor memory device as set forth in claim 10, wherein said irregular circuit area comprises peripheral circuits operatively connected to at least one of the word and bit lines.

17. A semiconductor memory device as set forth in claim 16, wherein said peripheral circuits comprises input/output circuits operatively connected to at least one of the word and bit lines.

* * * * *